United States Patent
Lai et al.

(10) Patent No.: US 12,308,818 B2
(45) Date of Patent: May 20, 2025

(54) SURFACE ACOUSTIC WAVE DEVICE

(71) Applicant: WIN SEMICONDUCTORS CORP., Taoyuan (TW)

(72) Inventors: Cheng-Yao Lai, Taoyuan (TW); Chia-Ta Chang, Taoyuan (TW); Meng-Tse Hsu, Taoyuan (TW); Ya-Chu Yang, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 212 days.

(21) Appl. No.: 18/149,371

(22) Filed: Jan. 3, 2023

(65) Prior Publication Data
US 2024/0223153 A1    Jul. 4, 2024

(51) Int. Cl.
*H03H 9/02* (2006.01)
*H03H 9/05* (2006.01)
*H03H 9/145* (2006.01)
*H03H 9/25* (2006.01)

(52) U.S. Cl.
CPC ........ *H03H 9/02661* (2013.01); *H03H 9/059* (2013.01); *H03H 9/14502* (2013.01); *H03H 9/14541* (2013.01); *H03H 9/25* (2013.01)

(58) Field of Classification Search
CPC .............. H03H 9/02661; H03H 9/059; H03H 9/14502; H03H 9/14541; H03H 9/25; H03H 9/02992
See application file for complete search history.

(56) References Cited

U.S. PATENT DOCUMENTS

| | | | |
|---|---|---|---|
| 6,552,475 B2* | 4/2003 | Hori | H03H 3/08 310/364 |
| 6,731,046 B2* | 5/2004 | Watanabe | H03H 9/02944 310/313 R |
| 7,764,007 B2* | 7/2010 | Furukawa | H01L 24/11 310/365 |
| 7,868,523 B2 | 1/2011 | Tanaka et al. | |
| 10,424,715 B2 | 9/2019 | Tsubokawa et al. | |
| 11,985,903 B2* | 5/2024 | Toyota | H03H 9/02992 |
| 2002/0024271 A1* | 2/2002 | Hori | H03H 3/08 310/313 B |
| 2002/0140322 A1* | 10/2002 | Suga | H03H 9/059 310/313 R |
| 2004/0065892 A1 | 4/2004 | Uemura | |
| 2004/0080049 A1* | 4/2004 | Kim | H01L 24/05 257/772 |

(Continued)

OTHER PUBLICATIONS

Chinese language office action dated Feb. 26, 2024, issued in application No. TW 112117097.

*Primary Examiner* — Andrea Lindgren Baltzell
*Assistant Examiner* — Kimberly E Glenn
(74) *Attorney, Agent, or Firm* — McClure, Qualey & Rodack, LLP (57) ABSTRACT

A surface acoustic wave (SAW) device includes: a substrate; a finger portion of an interdigital transducer (IDT) electrode disposed on the substrate; a pad portion of the interdigital transducer electrode electrically connected to the finger portion; and a wiring electrode disposed on the pad portion. The wiring electrode includes a contact metal layer and an aluminum-based layer. The contact metal layer is disposed between the pad portion and the aluminum-based layer. The contact metal layer includes platinum, palladium, or gold.

19 Claims, 5 Drawing Sheets

(56) References Cited

U.S. PATENT DOCUMENTS

| | | |
|---|---|---|
| 2009/0021109 A1 | 1/2009 | Furukawa |
| 2010/0225202 A1* | 9/2010 | Fukano .................. H03H 9/105 |
| | | 310/313 C |
| 2018/0069526 A1* | 3/2018 | Yamashita ............... H03H 9/25 |
| 2019/0165758 A1 | 5/2019 | Sakai |
| 2022/0077377 A1 | 3/2022 | Toyota |
| 2022/0116014 A1 | 4/2022 | Poirel |

* cited by examiner

SURFACE ACOUSTIC WAVE DEVICE

BACKGROUND

Technical Field

The present disclosure relates to a surface acoustic wave (SAW) device, and in particular it relates to the wiring electrode of a surface acoustic wave device.

Description of the Related Art

A surface acoustic wave device may utilize a wiring electrode electrically connected to the interdigital transducer electrode. The wiring electrode may function as a transmission line in order to transmit the electric signal or the surface wave between different terminals. However, higher contact resistance between the interdigital transducer electrode and the wiring electrode may decrease the performance of the surface acoustic wave device. Therefore, these and related issues need to be addressed through the design and manufacture of the surface acoustic wave device.

SUMMARY

In an embodiment, a surface acoustic wave (SAW) device includes: a substrate; a finger portion of an interdigital transducer (IDT) electrode disposed on the substrate; a pad portion of the interdigital transducer electrode electrically connected to the finger portion; and a wiring electrode disposed on the pad portion. The wiring electrode includes a contact metal layer and an aluminum-based layer. The contact metal layer is disposed between the pad portion and the aluminum-based layer. The contact metal layer includes platinum, palladium, or gold.

In another embodiment, a surface acoustic wave device includes: a substrate; a finger portion of an interdigital transducer electrode disposed on the substrate; a pad portion of the interdigital transducer electrode electrically connected to the finger portion; and a wiring electrode disposed on the pad portion. The wiring electrode includes an aluminum-based layer, and a first platinum layer disposed between the aluminum-based layer and the pad portion.

In yet another embodiment, a surface acoustic wave device includes: a substrate; a pad portion of an interdigital transducer electrode disposed on the substrate; and a wiring electrode disposed on the pad portion. The wiring electrode includes a contact metal layer and an aluminum-based layer. The contact metal layer is disposed between the pad portion and the aluminum-based layer. The contact metal layer includes platinum, palladium, or gold. The surface acoustic wave device further includes: a wall disposed on the wiring electrode and surrounding a finger portion of the interdigital transducer electrode disposed on the substrate; a roof disposed on the wall and covering the finger portion; a pillar structure disposed on the wiring electrode; and a bump disposed on the pillar structure. A cavity is defined by the substrate, the wall, and the roof. The finger portion is within the cavity.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in some embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

The wiring electrode of the surface acoustic wave device of the present disclosure includes a contact metal layer and an aluminum-based layer formed on the contact metal layer. In some embodiments, the contact metal layer is formed on a pad portion of the interdigital transducer electrode, and is made of platinum, palladium, or gold. Implementing the aforementioned materials allows the contact resistance between the wiring electrode and the interdigital transducer electrode to reduce, and thus the performante of the surface acoustic wave device can be improved.

A surface acoustic wave device may incorporate a wiring electrode to be electrically connected to the interdigital transducer electrode. The wiring electrode may extend outwardly to different terminals of the surface acoustic wave device, so the electrical connection can be established between various terminals. In some embodiments, the wiring electrode may be in direct contact with the interdigital transducer electrode. As a transmission line, the wiring electrode may be a composite layer of different metals.

The present disclosure incorporates an innovative contact metal layer made of platinum, palladium, or gold. When the contact metal layer of the wiring electrode (or the bottommost layer of the wiring electrode that is in direct contact with the interdigital transducer electrode) is made of platinum, palladium, or gold, any unwanted oxidation may be suppressed. In other words, platinum, palladium, or gold cannot be oxidized easily, thus the contact resistance between the interdigital transducer electrode and the wiring electrode can be maintained at a satisfying level. Through optimizing the materials used for the wiring electrode, the performance of the wiring electrode as the transmission line may be enhanced.

Figure 1:
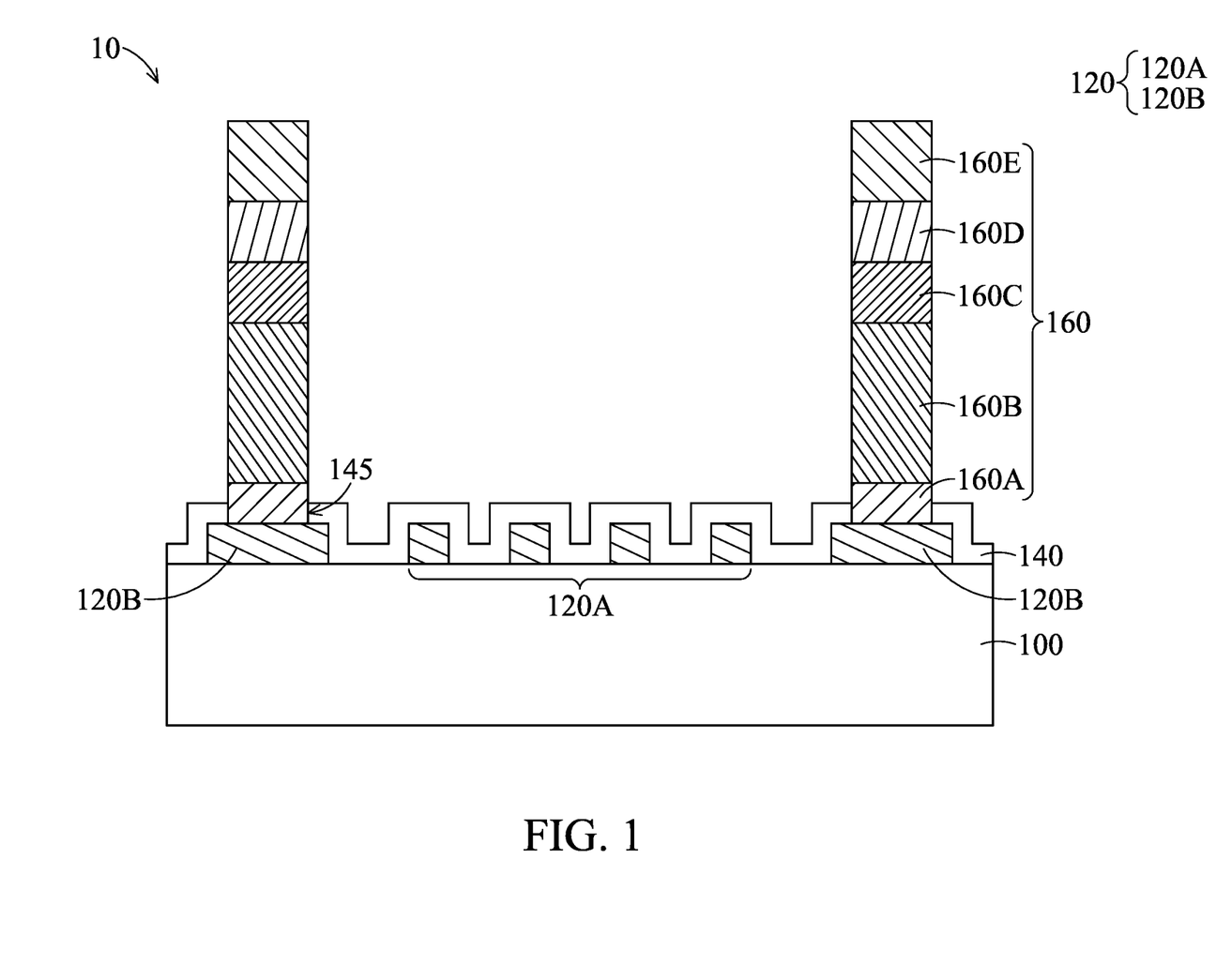
FIG. 1 is a cross-sectional view of a surface acoustic wave device, according to some embodiments of the present disclosure.

FIG. 1 is a cross-sectional view of a surface acoustic wave device 10, according to some embodiments of the present disclosure. According to some embodiments of the present disclosure, the surface acoustic wave device 10 includes a substrate 100, an interdigital transducer electrode 120, a dielectric layer 140, and a wiring electrode 160. The interdigital transducer electrode 120 may include finger portions 120A and pad portions 120B.

Referring to FIG. 1, the substrate 100 is provided. The substrate 100 may be, for example, a piezoelectric substrate. In some embodiments, the piezoelectric substrate may be made of a piezoelectric single crystal or a piezoelectric ceramic. For the piezoelectric single crystal, the substrate 100 may be a lithium niobate ($LiNbO_3$) substrate (or an LN substrate), or the substrate 100 may also be a lithium tantalate ($LiTaO_3$) substrate (or an LT substrate). Moreover, the substrate 100 may include zinc oxide (ZnO) and aluminum nitride (AlN). For the piezoelectric ceramic, the substrate 100 may include barium titanate (BTO, $BaTiO_3$), lead titanate ($PbTiO_3$), and lead zirconium titanate (PZT, $Pb(Zr, Ti)O_3$). In some embodiments, the piezoelectric substrate may be doped with another element.

In some embodiments, the substrate 100 may include a piezoelectric-on-insulator (POI) substrate. The piezoelectric-on-insulator substrate may include a base plate, an insulating layer disposed on the base plate, and a piezoelectric layer disposed on the insulating layer. The base plate may be a silicon layer. The insulating layer may include, for example, buried oxide (BOX) layers, nitride layers, or other suitable dielectric layers. Materials used for the piezoelectric layer may include, for example, the materials used for the above-mentioned piezoelectric substrates. In some embodiments, the piezoelectric-on-insulator substrate may improve the performance of the surface acoustic wave device 10.

Still referring to FIG. 1, the interdigital transducer electrode 120 may be disposed on the substrate 100. As mentioned previously, the interdigital transducer electrode 120 may include the finger portions 120A and the pad portions 120B, which are electrically connected with each other. The two pad portions 120B illustrated may be considered as two different terminals. From top view, the finger portions 120A extending from different terminals may be alternately arranged, or having the interleaved configuration.

Materials of the interdigital transducer electrode 120 may include metals, such as cobalt (Co), ruthenium (Ru), tungsten (W), aluminum (Al), copper (Cu), titanium (Ti), tantalum (Ta), silver (Ag), gold (Au), platinum (Pt), nickel (Ni), palladium (Pd), zinc (Zn), chromium (Cr), tin (Sn), molybdenum (Mo), niobium (Nb), manganese (Mn), iridium (Ir), osmium (Os), rhodium (Rh), rhenium (Re), the like, a combination thereof, an alloy thereof, or a multiple layer thereof. In a specific embodiment of the present disclosure, interdigital transducer electrode 120 may include an alloy of aluminum copper, with a dominating composition of aluminum.

Referring to FIG. 1, the dielectric layer 140 may be conformally formed on the substrate 100 and the interdigital transducer electrode 120 (such as the finger portions 120A and the pad portions 120B). In some embodiments, the dielectric layer 140 covers the substrate 100 and the interdigital transducer electrode 120 in order to provide mechanical protection and electrical insulation for the underlying structures. Materials of the dielectric layer 140 may include silicon nitride (SiN), aluminum nitride, silicon oxide (SiO), aluminum oxide (AlO), the like, or a combination thereof. The dielectric layer 140 may be formed by chemical vapor deposition (CVD), high-density plasma chemical vapor deposition (HDP-CVD), plasma-enhanced chemical vapor deposition (PECVD), flowable chemical vapor deposition (FCVD), sub-atmospheric chemical vapor deposition (SACVD), low-pressure chemical vapor deposition (LPCVD), atomic layer deposition (ALD), the like, or a combination thereof.

Still referring to FIG. 1, the via holes 145 may be formed in the dielectric layer 140. According to some embodiments of the present disclosure, the via holes 145 may be viewed as openings within the dielectric layer 140, allowing the elements below and above the dielectric layer 140 to establish electrical connection. In some embodiments, the via holes 145 allow the pad portions 120B of the interdigital transducer electrode 120 and the subsequently formed wiring electrode 160 to be electrically connected for conducting the electric signal and/or the surface acoustic wave. As shown in FIG. 1, the via holes 145 may be arranged on the pad portions 120B of the interdigital transducer electrode 120. The via holes 145 may be formed by patterning the dielectric layer 140. After the formation of the via holes 145, the dielectric layer 140 may only partially cover the pad portions 120B of the interdigital transducer electrode 120.

Referring to FIG. 1, the wiring electrode 160 may be disposed on the dielectric layer 140. In some embodiments, the wiring electrode 160 is disposed on the pad portions 120B of the interdigital transducer electrode 120, and is formed filling the via holes 145 to be in direct contact with the pad portions 120B of the interdigital transducer electrode 120. An electrical connection between the interdigital transducer electrode 120 and the wiring electrode 160 may be established. According to some embodiments of the present disclosure, the wiring electrode 160 includes the transmission line for carrying the electric signal and/or the surface acoustic wave toward other terminals of the surface acoustic wave device 10. In some embodiments, the wiring electrode 160 includes a bonding pad, such that additional components can be bonded thereon. In the present embodiment, the wiring electrode 160 may include a contact metal layer 160A, an aluminum-based layer 160B, and a cap metal layer, which are sequentially stacked from the bottom of the wiring electrode 160 to the top of the wiring electrode 160. In some embodiments, the cap metal layer is a multilayer structure which includes a titanium layer 160C, a platinum layer 160D, and a gold layer 160E. The titanium layer 160C, the platinum layer 160D, and the gold layer 160E may be sequentially stacked on the aluminum-based layer 160B of the wiring electrode 160. In some embodiments, the contact metal layer 160A is disposed between the pad portion 120B of the interdigital transducer electrode 120 and the aluminum-based layer 160B. The thicknesses of the contact metal layer 160A, the aluminum-based layer 160B, the titanium layer 160C, the platinum layer 160D, and the gold layer 160E may be between 10 nm and 40 nm, between 1800 nm and 2500 nm, between 70 nm and 150 nm, between 30 nm and 100 nm, and between 150 nm and 400 nm, respectively. The thicknesses may be adjusted to improve the performance of the surface acoustic wave device 10.

According to some embodiments of the present disclosure, the material of the contact metal layer 160A may include platinum, palladium, or gold. The inventor has discovered that the contact metal layer 160A of platinum, palladium, or gold disposed between the pad portion 120B of the interdigital transducer electrode 120 and the aluminum-based layer 160B can lower the contact resistance. As a result, the performance of the surface acoustic wave device 10 may be improved. Furthermore, platinum exhibits more superior anti-oxidation capability and mechanical characteristics. Therefore, utilizing platinum may further lower the contact resistance between the interdigital transducer electrode 120 and the wiring electrode 160, and may prevent the generation of cracks. The performance of the surface acoustic wave device 10 may be further enhanced.

Depending on the application and the design requirements, the aluminum-based layer 160B of the wiring electrode 160 may be pure aluminum or different types of alloy including a dominant composition of aluminum mixing with other metals, hence the metal layer is named with the term "aluminum-based". In some embodiments, the titanium layer 160C, the platinum layer 160D, and the gold layer 160E of the cap metal layer include titanium, platinum, and gold, respectively, as these elements are named.

In some embodiments, the contact metal layer 160A, the aluminum-based layer 160B, and the cap metal layer (including the titanium layer 160C, the platinum layer 160D, and the gold layer 160E) of the wiring electrode 160 may all be patterned using the same photo mask, in order to lower the overall manufacture cost. The resulting lateral dimensions (or the widths) of the contact metal layer 160A, the aluminum-based layer 160B, the titanium layer 160C, the platinum layer 160D, and the gold layer 160E may be substantially the same. For example, the ratio of the width of the contact metal layer 160A to the width of the aluminum-based layer 160B may be between 0.8 and 1.2, for example, 1.0. The ratio can be adjusted to improve the performance of the surface acoustic wave device 10.

After the deposition of the wiring electrode 160, a thermal treatment may be performed. The thermal treatment may be carried out in-situ or ex-situ, and may be any types of annealing process, such as rapid thermal anneal (RTA), spike anneal, soak anneal, laser anneal, furnace anneal, or the like. The processing temperature of the thermal treatment may be between 800° C. and 1000° C. The processing temperature may need to be high enough to enhance the contact between the metal material of the interdigital transducer electrode 120 and the metal material of the wiring electrode 160. When the contact metal layer 160A between the aluminum-based layer 160B and the pad portion 120B is made of platinum, palladium, or gold, the contact resistance between the interdigital transducer electrode 120 and the wiring electrode 160 can achieve at a satisfying level after the thermal treatment.

Figure 2A:
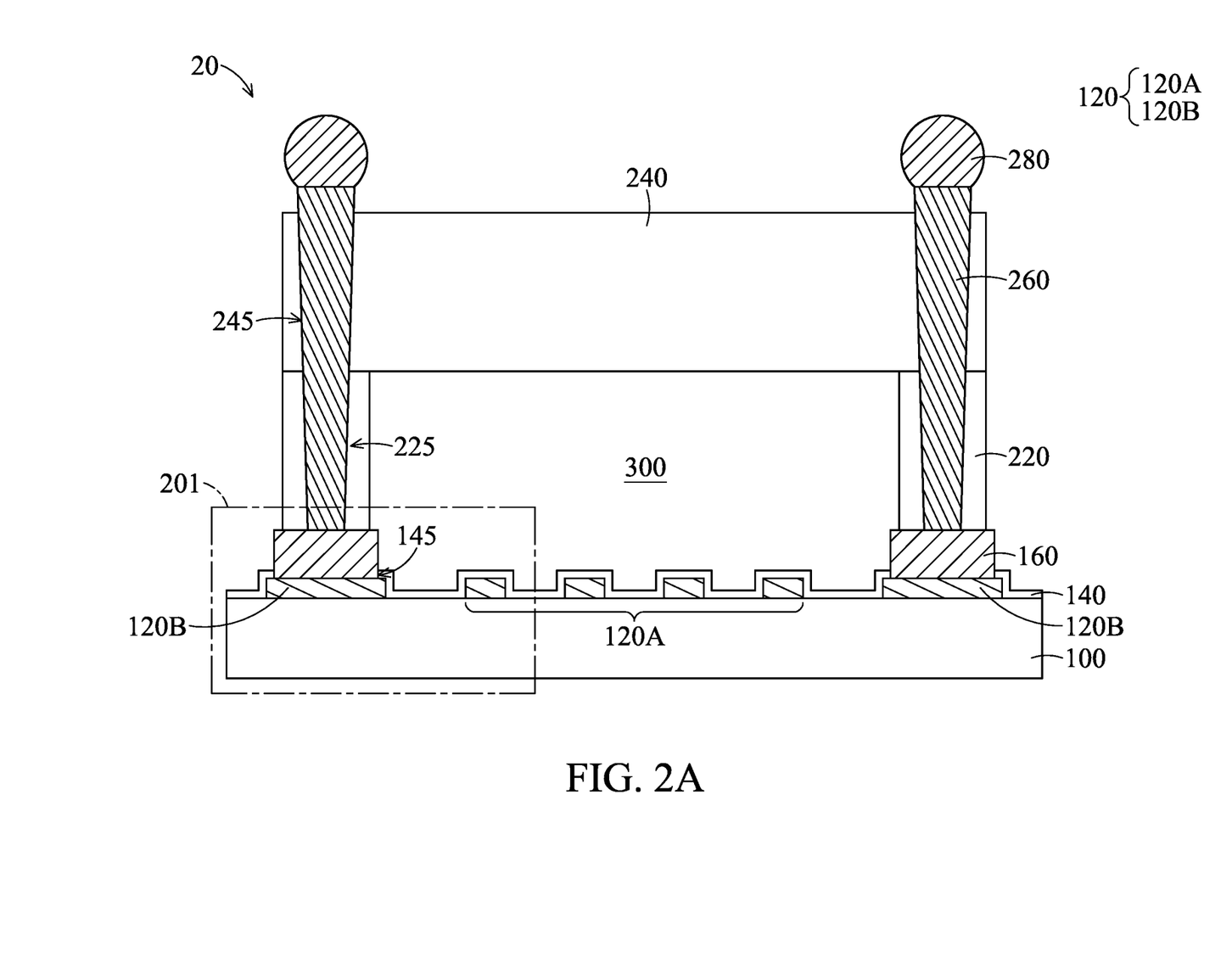
FIG. 2A is a cross-sectional view of a surface acoustic wave device, according to some embodiments of the present disclosure.

FIG. 2A is a cross-sectional view of a surface acoustic wave device 20, according to some embodiments of the present disclosure. In comparison with FIG. 1, a wafer-level package (WLP) is incorporated into the surface acoustic wave device 20. The wafer-level package may include a wall 220, a roof 240, a pillar structure 260, and a bump 280. The pillar structure 260 may be electrically connected to the wiring electrode 160 through via holes 225 and via holes 245. The features of the substrate 100, the interdigital transducer electrode 120 (including the finger portions 120A and the pad portions 120B), the dielectric layer 140, the via holes 145, and the wiring electrode 160 are similar to those illustrated in FIG. 1, and the details are not described again herein to avoid repetition.

Referring to FIG. 2A, the wall 220 may be disposed on the wiring electrode 160. In some embodiments, the wall 220 may be placed to laterally surround the finger portions 120A of the interdigital transducer electrode 120. From top view, the wall 220 has a frame configuration, which may have any suitable geometrical shapes encircling the finger portions 120A of the interdigital transducer electrode 120. According to some embodiments of the present disclosure, the wall 220 may define the position of the subsequently formed pillar structure 260. The thickness of the wall 220 may be between 15 μm and 35 μm. The thickness may be adjusted to improve the performance of the surface acoustic wave device 20. Materials of the wall 220 may include photo-resist, epoxy resin, resin, polymers, other applicable materials, or a combination thereof. The wall 220 may be deposited and patterned by any suitable process.

Still referring to FIG. 2A, the via holes 225 may be formed in the wall 220. According to some embodiments of the present disclosure, the via holes 225 may be viewed as openings within the wall 220, exposing a portion of the wiring electrode 160. The via holes 225 may be formed by any suitable patterning process.

Referring to FIG. 2A, the roof 240 may be disposed on the wall 220. In some embodiments, the roof 240 may cover the entire finger portions 120A of the interdigital transducer electrode 120 and a part of the dielectric layer 140, but the subsequently formed pillar structure 260 may be exposed through the roof 240. The thickness of the roof 240 may be between 10 μm and 25 μm. The thickness may be adjusted to improve the mechanical properties of the wafer-level package. The ratio of the thickness of the wall 220 to the thickness of the roof 240 may be between 0.8 and 1.2, for example, 1.0. The material and the formation of the roof 240 may be similar to those of the wall 220, and the details are not described again herein to avoid repetition. The wall 220 and the roof 240 may be manufactured by the same material and have substantially the same thickness. Therefore, some of the process parameters in manufacturing the two elements can be the same or similar with each other, which may reduce the complexity and cost of the manufacturing process.

Still referring to FIG. 2A, the via holes 245 may be formed in the roof 240. According to some embodiments of the present disclosure, the via holes 245 may be viewed as openings within the roof 240, exposing the via holes 225. The formation of the via holes 245 may be similar to that of the via holes 225, and the details are not described again herein to avoid repetition. In some embodiments, the via holes 225 and the via holes 245 may be extended continuously after both the wall 220 and the roof 240 are deposited. In doing so, the via holes 245 within the roof 240 may be aligned with the via holes 225 within the wall 220.

Referring to FIG. 2A, the pillar structure 260 may be formed filling the via holes 225 and the via holes 245, and may be disposed on the wiring electrode 160. From another point of view, the pillar structure 260 may be formed penetrating the roof 240 and the wall 220. In some embodiments, the pillar structure 260 is in direct contact with and electrically connected to the topmost metal layer of the wiring electrode 160. Moreover, the pillar structure 260 may protrude beyond the upper surface of the roof 240. According to some embodiments of the present disclosure, the pillar structure 260 may be a conductive element that connects the wiring electrode 160 with the subsequently formed bump 280. It should be noted that from top view, the via holes 225 and the via holes 245 may be formed into any suitable geometrical shapes, and the pillar structure 260 may adopt the collective profile of the via holes 225 and the via holes 245. Depending on the application and the design requirements, the pillar structure 260 may have a vertical sidewall or a slanted sidewall. Materials of the pillar structure 260 may include any suitable metals or alloys mentioned above, such as copper, copper nickel gold alloy, the like, or a combination thereof. The pillar structure 260 may be formed by any suitable process (such as plating or the like).

Still referring to FIG. 2A, the bump 280 may be disposed on the pillar structure 260. In some embodiments, the bump 280 may also be referred to as a "solder ball". According to some embodiments of the present disclosure, the bump 280 may be functioned to connect the surface acoustic wave device 20 with other components, such as a printed circuit board (PCB). Materials of the bump 280 may include any suitable metals mentioned above, such as tin, gold, silver, lead, the like, a combination thereof, or an alloy thereof. The bump 280 may be thermally bonded onto the pillar structure 260 using a bonding equipment, followed by a reflow process.

Referring to FIG. 2A, a cavity 300 may be formed above the finger portions 120A of the interdigital transducer electrode 120 and below the roof 240. From another point of view, the finger portions 120A of the interdigital transducer electrode 120 may be disposed within the cavity 300. In some embodiments, the cavity 300 is laterally surrounded by the wall 220. In some embodiments, the cavity 300 may be defined by the substrate 100, the wall 220, and the roof 240. The lower surface of the roof 240 may be fixed to the upper surface of the wall 220, so the space below the roof 240 is not filled. According to some embodiments of the present disclosure, the cavity 300 is a void that is substantially made of air.

Figure 2B:
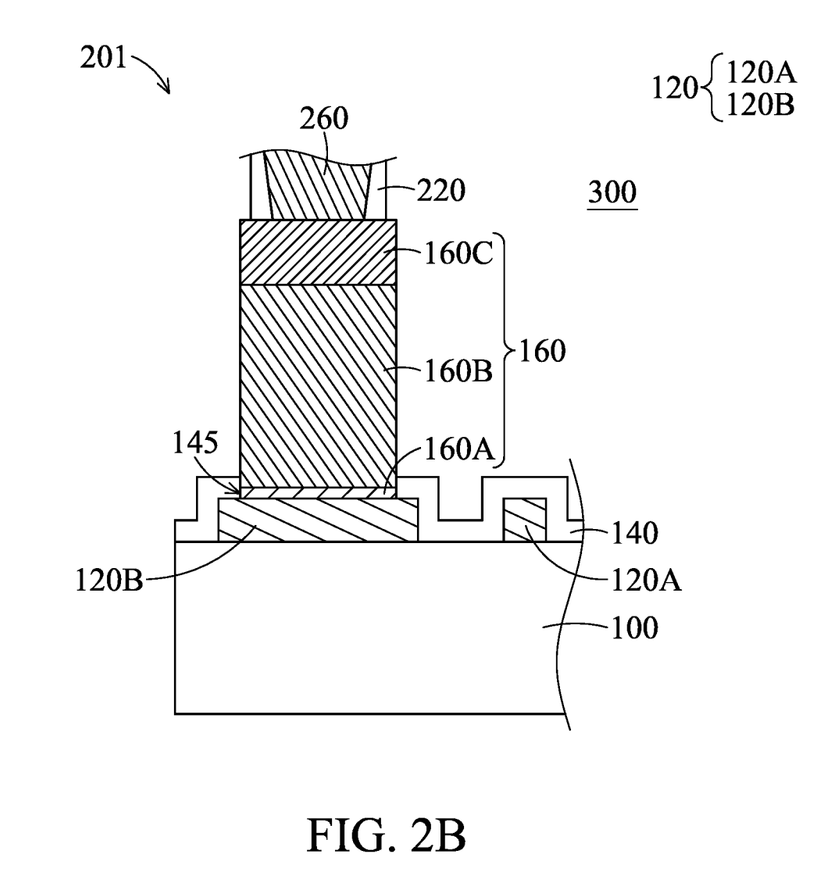
FIG. 2B is an enlarged view of the surface acoustic wave device illustrated in FIG. 2A, according to some embodiments of the present disclosure.

FIG. 2B is an enlarged view of a region 201 labeled in FIG. 2A, according to some embodiments of the present disclosure. In some embodiments, the wiring electrode 160 includes the contact metal layer 160A, the aluminum-based layer 160B, and the cap metal layer. In the present embodiment, the cap metal layer may only include the titanium layer 160C, but the present disclosure is not limited thereto. For illustrated purpose, the roof 240 and the bump 280 are omitted.

Referring to FIG. 2B, when the wafer-level package (including the wall 220, the roof 240, the pillar structure 260, and the bump 280) is incorporated into the surface acoustic wave device 20, the pillar structure 260 may be in direct contact with and electrically connected to the titanium layer 160C of the wiring electrode 160.

Figure 3:
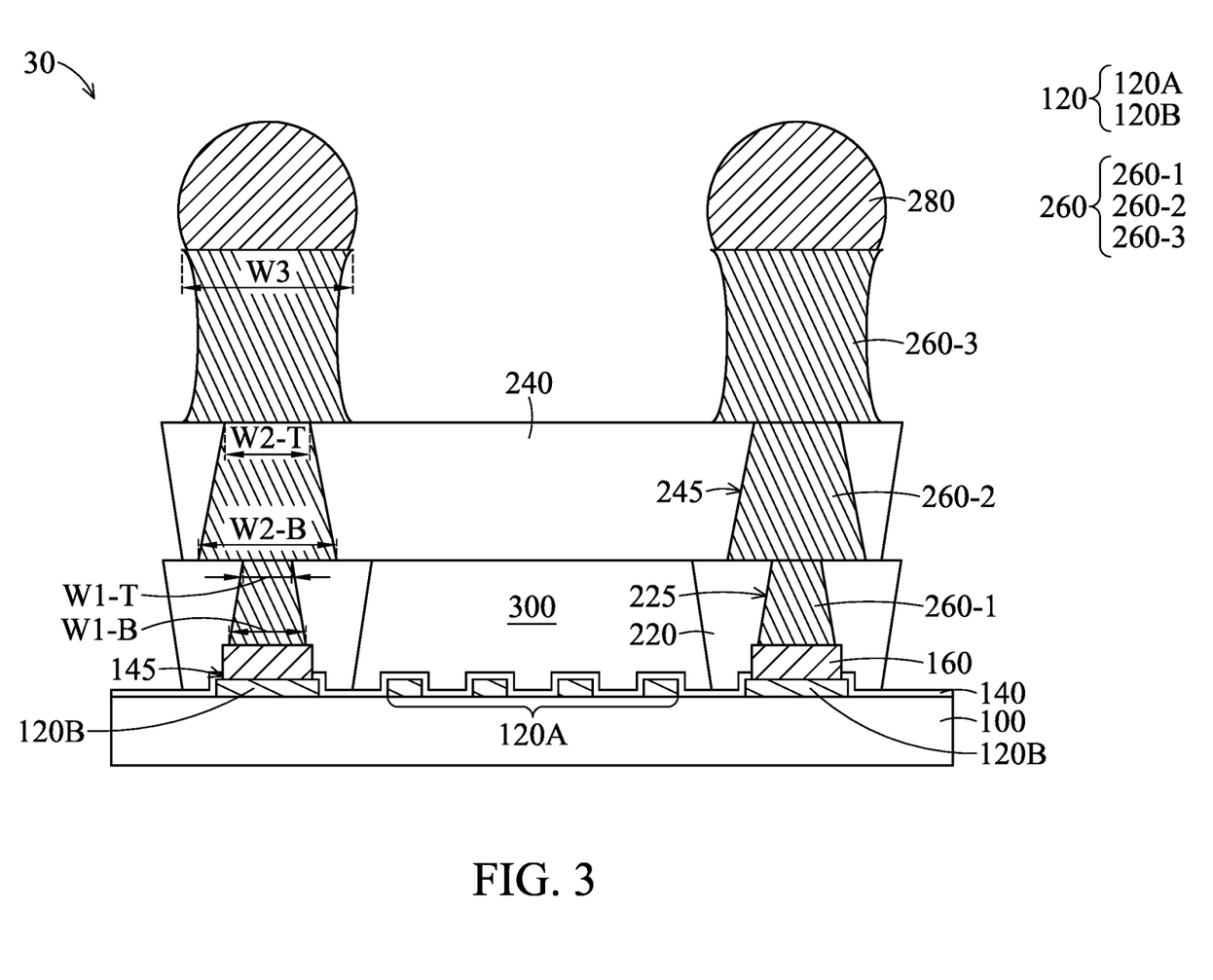
FIG. 3 is a cross-sectional view of a surface acoustic wave device, according to some embodiments of the present disclosure.

FIG. 3 is a cross-sectional view of a surface acoustic wave device 30, according to some embodiments of the present disclosure. In comparison with FIG. 2A, the via holes 245 within the roof 240 may not be aligned with the via holes 225 within the wall 220. The pillar structure 260 may include a first portion 260-1, a second portion 260-2, and a third portion 260-3. The first portion 260-1 and the second portion 260-2 may be disposed within the wall 220 and the roof 240, respectively. Moreover, the third portion 260-3 may protrude beyond the upper surface of the roof 240, and may be electrically connected to the bump 280.

Referring to FIG. 3, the wall 220 may laterally extend beyond the opposing edges of the pad portions 120B of the interdigital transducer electrode 120 and the opposing edges of the wiring electrode 160. In other words, the wall 220 may completely cover the pad portions 120B of the interdigital transducer electrode 120 and the wiring electrode 160, and may cover a part of the dielectric layer 140. In a specific embodiment of the present disclosure, the wall 220 and the roof 240 may both be patterned using a negative-type photoresist. The sidewalls of the wall 220 and the roof 240 are inclined relative to the substrate 100. Additionally, the sidewalls of the via holes 225 and the via holes 245 are also inclined relative to the substrate 100. Due to the characteristics of the negative-type photoresist, the photolithography process may result in the patterns having openings with gradually expanding dimension toward the substrate 100 (or openings with gradually expanding dimension away from the exposure light source). Based on the photomask design, the openings may reveal the sidewalls of the wall 220 and the roof 240, as well as the sidewalls of the via holes 225 and the via holes 245. In some embodiments, the wall 220 and the roof 240 may both be patterned using a positive-type photoresist with the sidewalls of the wall 220 and the roof 240 are inclined relative to the substrate 100.

Still referring to FIG. 3, the via holes 225 and the via holes 245 may not be formed concurrently. The via holes 225 may be formed after the formation of the wall 220, and before the formation of the roof 240. The via holes 245 may be formed after the formation of the roof 240.

Referring to FIG. 3, the first portion 260-1, the second portion 260-2, and the third portion 260-3 of the pillar structure 260 may be sequentially stacked on the wiring electrode 160. In some embodiments, the second portion 260-2 may be vertically located and connected between the first portion 260-1 and the third portion 260-3. The first portion 260-1 may include a bottom width W1-B and a top width W1-T, and the second portion 260-2 may include a bottom width W2-B and a top width W2-T. Furthermore, the third portion 260-3 may be designed with inwardly concave sidewalls, and may include a maximum width W3.

In some embodiments, the top width W1-T is smaller than the bottom width W1-B, while the top width W2-T is smaller than the bottom width W2-B. According to some embodiments of the present disclosure, the top width W2-T of the second portion 260-2 is larger than the bottom width W1-B of the first portion 260-1, and the maximum width W3 of the third portion 260-3 is larger than the bottom width W2-B of the second portion 260-2. It should be appreciated that the bottom width W1-B, the top width W1-T, the bottom width W2-B, the top width W2-T, and the maximum width W3 may be adjusted to improve the mechanical properties of the wafer-level package.

Figure 4:
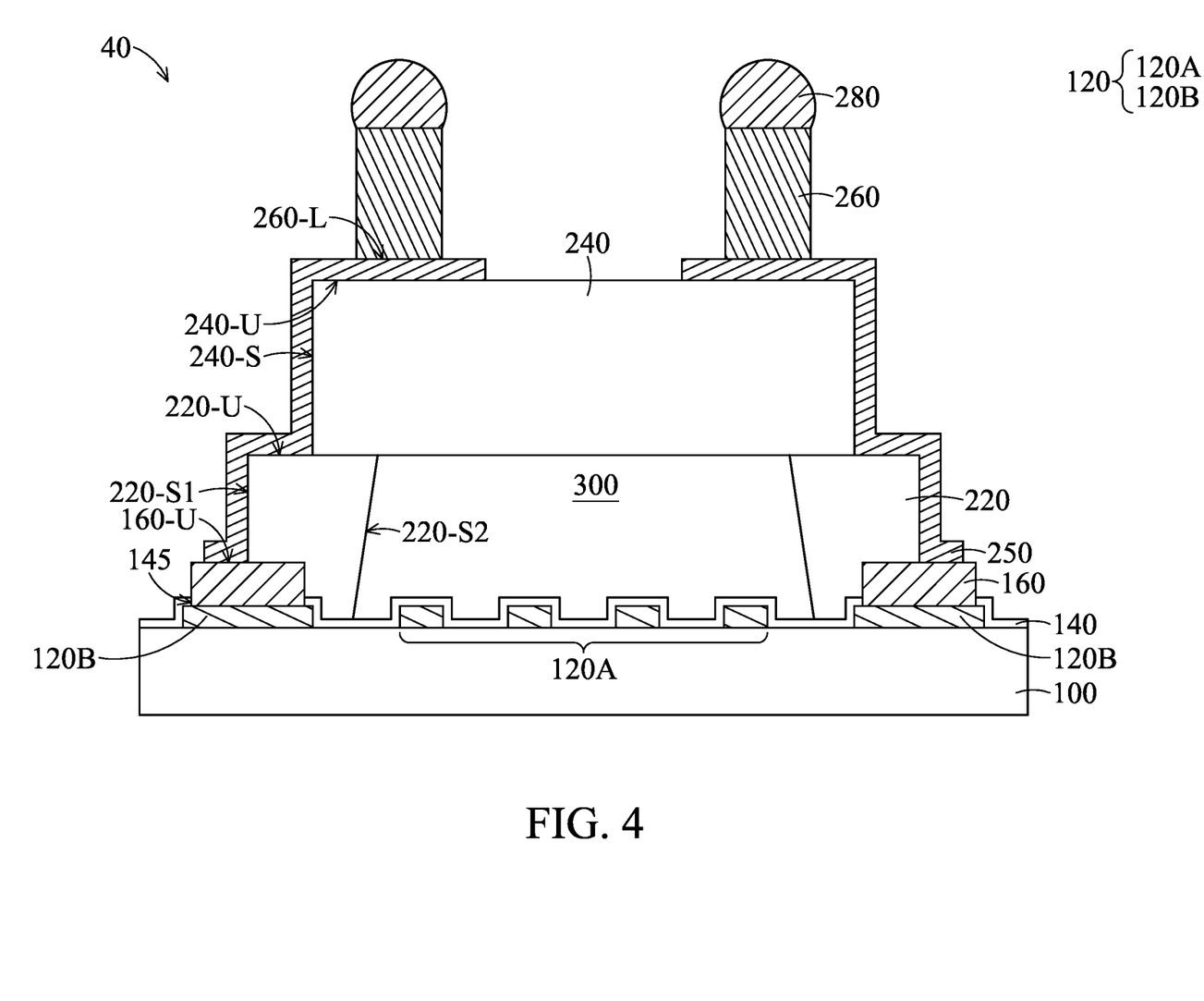
FIG. 4 is a cross-sectional view of a surface acoustic wave device, according to some embodiments of the present disclosure.

FIG. 4 is a cross-sectional view of a surface acoustic wave device 40, according to some embodiments of the present disclosure. The pillar structure 260 is not in direct contact with the topmost metal layer (for example, the titanium layer 160C shown in FIG. 2B) of the wiring electrode 160. In some embodiments, as shown in FIG. 4, a conductive layer 250 is incorporated into the surface acoustic wave device 40.

Referring to FIG. 4, the conductive layer 250 may extend from an upper surface 160-U of the wiring electrode 160 to a lower surface 260-L of the pillar structure 260, such that the wiring electrode 160 and the pillar structure 260 may be electrically coupled with each other. In comparison with FIG. 3, the wall 220 may laterally extend beyond one edge of pad portions 120B of the interdigital transducer electrode 120 and one edge of the wiring electrode 160. More specifically, the wall 220 extends toward the working area (where the finger portions 120A of the interdigital transducer electrode 120 are located) of the surface acoustic wave device 40 and cover a part of the dielectric layer 140, while a considerable portion of the upper surface 160-U of the wiring electrode 160 away from the finger portions 120A of the interdigital transducer electrode 120 is exposed from the wall 220. In doing so, a step-like configuration may be formed between the wiring electrode 160 and the wall 220. In some embodiments, instead of covering the entire structure of the surface acoustic wave device 40, the roof 240 may only cover the working area and a portion of an upper surface 220-U of the wall 220. As a result, another step-like configuration may be formed between the wall 220 and the roof 240. The step-like configurations of the wiring electrode 160, the wall 220, and the roof 240 enable the conductive layer 250 to conformally and continuously extend onto the exposed portion of the upper surface 160-U of the wiring electrode 160, an outer sidewall 220-S1 of the wall 220, the exposed portion of the upper surface 220-U of the wall 220, an sidewall 240-S of the roof 240, and an upper surface 240-U of the roof 240.

Referring to FIG. 4, the wall 220 may laterally surround the finger portions 120A of the interdigital transducer electrode 120, and the cavity 300 may be defined by the substrate 100, the wall 220, and the roof 240. The conductive layer 250 may be disposed on the outer sidewall 220-S1 and the upper surface 220-U of the wall 220, and the sidewall 240-S and the upper surface 240-U of the roof 240 outside the cavity 300. Materials of the conductive layer 250 may include any suitable metals (such as molybdenum, tungsten, titanium, iridium, palladium, platinum, nickel, cobalt, chromium, ruthenium, osmium, rhodium, tantalum, aluminum, copper, gold, rhenium, the like, or a combination thereof), metal alloys (such as titanium tungsten (TiW), aluminum copper (AlCu), or the like), metal nitride (such as tantalum nitride (TaN) or the like), metal silicide (such as tungsten silicide (WSi) or the like), the like, or a combination thereof. The conductive layer 250 may be formed by any suitable process.

In some embodiments, an inner sidewall 220-S2 of the wall 220 opposite to the outer sidewall 220-S1 is in contact with the cavity. As shown in FIG. 4, the inner sidewall 220-S2 is inclined relative to the substrate 100, while the outer sidewall 220-S1 is perpendicular to the substrate 100. In doing so, for example, a top width of the cavity 300 may be less than a bottom width of the cavity 300, but the present disclosure is not limited thereto. In some embodiments, the inner sidewall 220-S2 of the wall 220 may be perpendicular to the substrate 100. In some embodiments, the outer sidewall 220-S1 of the wall 220 may be inclined relative to the substrate 100, but the present disclosure is not limited thereto. In other words, the outer sidewall 220-S1 and the inner sidewall 220-S2 may respectively be both perpendicular, both inclined, perpendicular and inclined, or inclined and perpendicular, in association with the substrate 100.

Depending on the application and the design requirements, any of the surface acoustic wave device 20, the surface acoustic wave device 30, and the surface acoustic wave device 40 having the wafer-level package may be selected to connect with other components, such as a printed circuit board.

As mentioned above, in the present disclosure, when the contact metal layer including platinum, palladium, or gold is disposed between the pad portion and the aluminum-based layer, the contact resistance between the interdigital transducer electrode and the wiring electrode can be maintained at a satisfying level. Moreover, the contact metal layer made of platinum may further reduce the contact resistance between the interdigital transducer electrode and the wiring electrode, and prevent the generation of cracks.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A surface acoustic wave device, comprising:
a substrate;
a finger portion of an interdigital transducer (IDT) electrode disposed on the substrate;
a pad portion of the interdigital transducer electrode electrically connected to the finger portion; and
a wiring electrode disposed on the pad portion, wherein the wiring electrode comprises a contact metal layer and an aluminum-based layer, wherein the contact metal layer is disposed between the pad portion and the aluminum-based layer, and the contact metal layer comprises platinum, palladium, or gold, wherein the wiring electrode further comprises a titanium layer disposed on the aluminum-based layer.

2. The surface acoustic wave device of claim 1, wherein the interdigital transducer electrode comprises aluminum.

3. The surface acoustic wave device of claim 1, wherein the wiring electrode is in direct contact with the pad portion.

4. The surface acoustic wave device of claim 1, further comprising a dielectric layer covering the finger portion.

5. The surface acoustic wave device of claim 1, further comprising a platinum layer and a gold layer sequentially disposed on the titanium layer.

6. The surface acoustic wave device of claim 1, further comprising:
a wall disposed on the wiring electrode and surrounding the finger portion;
a roof disposed on the wall and covering the finger portion, wherein the wall and the roof form a cavity, and the finger portion is disposed in the cavity;
a pillar structure disposed on the wiring electrode, wherein the pillar structure penetrates through the wall and the roof; and
a bump disposed on the pillar structure.

7. The surface acoustic wave device of claim 1, wherein a ratio of a width of the contact metal layer to a width of the aluminum-based layer is between 0.8 and 1.2.

8. A surface acoustic wave device, comprising:
a substrate;
a finger portion of an interdigital transducer electrode disposed on the substrate;
a pad portion of the interdigital transducer electrode electrically connected to the finger portion; and
a wiring electrode disposed on the pad portion, comprising:
an aluminum-based layer; and
a first platinum layer disposed between the aluminum-based layer and the pad portion.

9. The surface acoustic wave device of claim 8, further comprising a dielectric layer covering the interdigital transducer electrode.

10. The surface acoustic wave device of claim 8, wherein the wiring electrode further comprises a titanium layer disposed on the aluminum-based layer.

11. The surface acoustic wave device of claim 10, wherein the wiring electrode further comprising:
a second platinum layer disposed on the titanium layer; and
a gold layer disposed on the second platinum layer.

12. A surface acoustic wave device, comprising:
a substrate;
a pad portion of an interdigital transducer electrode disposed on the substrate;
a wiring electrode disposed on the pad portion, wherein the wiring electrode comprises a contact metal layer and an aluminum-based layer, wherein the contact metal layer is disposed between the pad portion and the aluminum-based layer, and the contact metal layer comprises platinum, palladium, or gold;
a wall disposed on the wiring electrode and surrounding a finger portion of the interdigital transducer electrode disposed on the substrate;
a roof disposed on the wall and covering the finger portion, wherein a cavity is defined by the substrate, the wall and the roof, and the finger portion is within the cavity;
a pillar structure disposed on the wiring electrode; and
a bump disposed on the pillar structure.

13. The surface acoustic wave device of claim 12, wherein the pillar structure penetrates through the wall and the roof, and is electrically connected to the wiring electrode.

14. The surface acoustic wave device of claim 12, further comprising a conductive layer disposed on the wiring electrode and electrically connected between the pillar structure and the wiring electrode, wherein the conductive layer extends onto the roof.

15. The surface acoustic wave device of claim 14, wherein the conductive layer is disposed on a sidewall of the roof, an upper surface of the wall, and a sidewall of the wall.

16. The surface acoustic wave device of claim 12, wherein the wiring electrode further comprises a titanium layer disposed on the aluminum-based layer.

17. The surface acoustic wave device of claim 16, wherein the pillar structure is electrically connected to the titanium layer of the wiring electrode.

18. The surface acoustic wave device of claim 12, wherein a ratio of a width of the contact metal layer to a width of the aluminum-based layer is between 0.8 and 1.2.

19. The surface acoustic wave device of claim 12, wherein a ratio of a thickness of the wall to a thickness of the roof is between 0.8 and 1.2.

* * * * *